United States Patent
Vinay (10) Patent No.: US 8,970,151 B2
(45) Date of Patent: Mar. 3, 2015

(54) DETECTION OF BACK EMF IN TWO TERMINAL ACTUATOR

(71) Applicant: Texas Instruments Incorporated, Dallas, TX (US)

(72) Inventor: Vikas Suma Vinay, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 174 days.

(21) Appl. No.: 13/799,366

(22) Filed: Mar. 13, 2013

(65) Prior Publication Data

US 2014/0265969 A1 Sep. 18, 2014

(51) Int. Cl.
*H02P 6/18* (2006.01)
*H02P 23/00* (2006.01)

(52) U.S. Cl.
CPC .................................. *H02P 23/0036* (2013.01)

USPC ............. 318/400.34; 318/400.04; 318/400.09

(58) Field of Classification Search
USPC ............. 318/400.34, 400.04, 400.09, 400.05, 318/558, 490, 400.23
See application file for complete search history.

(56) References Cited

U.S. PATENT DOCUMENTS

2013/0043814 A1* 2/2013 Chuah et al. ............. 318/400.04

* cited by examiner

*Primary Examiner* — Karen Masih
(74) *Attorney, Agent, or Firm* — Alan A. R. Cooper; Frederick J. Telecky, Jr.

(57) ABSTRACT

Back-emf for a motor is measured by measuring a voltage across the input terminals for a two terminal input actuator or motor when a high frequency driver having a recirculation phase for the motor applies an instantaneous high frequency zero voltage during normal operation of the driver. By a further approach, current across the two terminal input is measured such that the measurement can be taken when the current crosses a given threshold near zero.

14 Claims, 6 Drawing Sheets

DETECTION OF BACK EMF IN TWO TERMINAL ACTUATOR

TECHNICAL FIELD

This invention relates generally to electric motor controllers, and more specifically to detecting back-emf in actuators to facilitate actuator control.

BACKGROUND

An electrical generator converts mechanical energy to electrical energy. An electric motor does the opposite; it converts electrical energy to mechanical energy. More specifically, a voltage can be applied to drive an electric motor. When an electric actuator or motor is in motion, there is relative motion between the armature of the motor and a magnetic field in the motor. This relative motion generates a voltage within the motor that opposes the applied drive voltage. This motor-generated voltage is known as the Back-emf (BEMF), which has a magnitude proportional to the velocity of the motor's armature. This is a fundamental property of all actuators and is reliant on the same principles as a generator.

Because the BEMF is an inherent property of any actuator, the ability to measure it precisely allows for the use of a vast variety of control schemes. Controlling the BEMF and driving the actuator to the correct BEMF value allows for precise control of the actuator velocity and in turn the displacement of an associated physical element. Without such accuracy, problems in systems employing so controlled motors can occur. For example, if the BEMF estimate is higher than the true value, the actuator will be driven slower than desired. This can be undesirable in applications like cooling systems where running a fan too slow may cause the system to overheat. If the estimate is lower than the true value, the actuator will be driven too quickly. This can result in the actuator diaphragm hitting the wall of the casing in a speaker, for example, and causing distortion in output and/or damage to the actuator.

Various methods to track the BEMF are known. One example uses direct sensing of the BEMF, which systems require the actuator terminals to be tri-stated while measuring the BEMF. To make such a measurement, the motor driver needs to be cut off, which is undesirable in many cases and can cause a ringing in system that adds error and/or delay in taking the measurement. Moreover, such approaches also require the use of 3-Terminal motors.

Another example approach is to estimate the BEMF by measuring the voltage and/or current directed into the actuator. Such approaches have various drawbacks including requiring "sense resistors," which reduce efficiency and take up area on the die or board supporting the electronics. This approach also requires complicated digital logic to derive the value of BEMF from the measured drive voltage current values and is more susceptible to variations in actuator parameters as well as variations due to temperature. Also, this approach depends on accurate and stable values for the voltage, current, and the DC resistance (Rdc) of the actuator. This is a non-trivial proposition because the Rdc of the motor varies with temperature and variables in production, and the accuracy of current and voltage measurements are limited in circuit implementations, largely due to non-idealities in the measurement circuitry and to interaction and noise coupling from the driver circuit. For example, the current measurements typically are accurate to 7-14% and voltage measurements to about 5-10%. This results in approximately 10 to 20% error in calculated BEMF values without taking temperature effects into account. Moreover, implementation of the BEMF calculations using the measured voltage and current add calculation errors that add up to the BEMF error because the calculations require floating point operations that are usually limited in accuracy by restrictions on speed and implementation of the digital logic due to area concerns.

SUMMARY

Generally speaking and pursuant to these various embodiments, BEMF is measured by measuring a voltage across the input terminals for a two terminal input actuator or motor when a high frequency driver having a recirculation phase for the motor applies an instantaneous high frequency zero voltage during normal operation of the driver. By a further approach, current across the two terminal input is determined such that the BEMF measurement can be taken when the current crosses a given threshold near zero. Simulations of this approach indicate an error of determining the BEMF of less than 2%. These and other benefits may become clear upon making a thorough review and study of the following detailed description.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
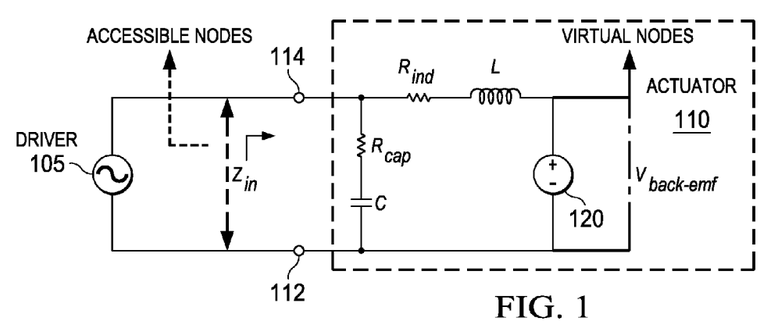
FIG. 1 comprises a circuit diagram of an effective driver and actuator illustrating the actual nodes available for sensing as compared to the virtual nodes for BEMF.

Referring now to the drawings, and in particular to FIG. 1, the Back-emf (BEMF) and options for detecting the BMEF will be described. A driver is electrically connected to provide a drive voltage across an actuator's 110 terminals 112 and 114. When viewed from the point of view of the terminals 112 and 114, the actuator 110 has electrical features including inductive and capacitive features represented by the inductor L, inductive resistance $R_{ind}$, capacitor C, and capacitive resistance $R_{cap}$. As described above, the actuator 110 physically includes an armature that rotates in response to the voltage applied by the driver 105. The motor armature will continue to rotate as a result of its inertia. This rotation relative to a magnetic field present within the actuator 110 creates the BEMF, which electrically looks like a voltage across the actuator, represented in FIG. 1 as a voltage source 120 having a value of $V_{back-emf}$. The problem with measuring BEMF in a 2-Terminal (2T) 112 and 114 actuator 110 is that the voltage generated by the actuator 110 is only present when the actuator 110 is in motion, but to be in motion, the actuator 110 needs to be driven by an external source such as the driver 105. If we try to measure the voltage across the actuator terminals while it is being driven, however, one would measure the voltage being used to drive it and not the BEMF. Instead, the BEMF can be understood as present across virtual nodes on either side of element 120 within the actuator 110, which nodes cannot be accessed from the outside world. Therefore, one cannot typically directly "sense" the BEMF while driving the load. This disclosure presents an approach to do this.

Figure 2:
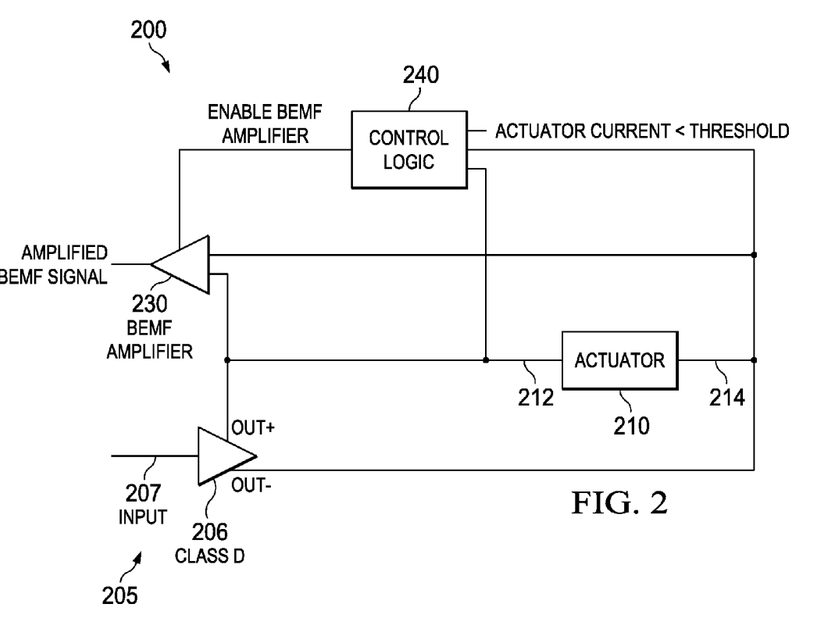
FIG. 2 comprises a schematic diagram of an example approach to motor control and sensing BEMF as configured in accordance with various embodiments of the invention.

Turning to FIG. 2, an apparatus 200 is illustrated that is configured to measure the BEMF in such conditions. The apparatus 200 includes a high frequently driver 205 having a recirculation phase connected to drive a motor or actuator 210 across a two terminal input 212 and 214 for the motor 210. In the illustrated example, the driver 205 is a class D amplifier 206 having an input configured to receive control signaling to control the driver 205, although other high frequency drivers can be applied. A voltage sensor 230 is connected across the two terminal input 212 and 214. A controller 240 is operatively coupled to the driver 205 and the voltage sensor 230 to activate the voltage sensor 230 to measure a voltage representative of back-emf of the motor 210 across the two terminal input 212 and 214 when an instantaneous high frequency input from the driver 205 to the motor 214 is approximately zero Volts. In one approach, the controller 240 monitors an output from the driver 205 to determine when the instantaneous high frequency input from the driver 205 to the motor 210 is approximately zero Volts by being connected across the terminals 212 and 214 to monitor the applied signal. In other approaches, this zero volt input point may be determined by monitoring the input to the driver 205, modeling the driver 205, or by other methods know in the art. By one approach described below, the driver 205 may be BD or Low Side Recirculation (LSR) modulated class D driver where the controller 240 is configured to activate the voltage sensor 230 to measure the back-emf when the instantaneous high frequency input applied by the BD or Low Side Recirculation modulated class D driver 206 is zero during a recirculation phase for the BD or Low Side Recirculation modulated class D driver 206. By measuring the voltage across the terminals 212 and 214 during operation of the motor 210 but at a point in time when the driver 205 output is momentarily zero through normal operation of the driver as opposed to fully stopping the driver as done in certain prior approaches, one can sense more directly the BEMF for the actuator 210 without artificially removing the driver input.

Figure 3:
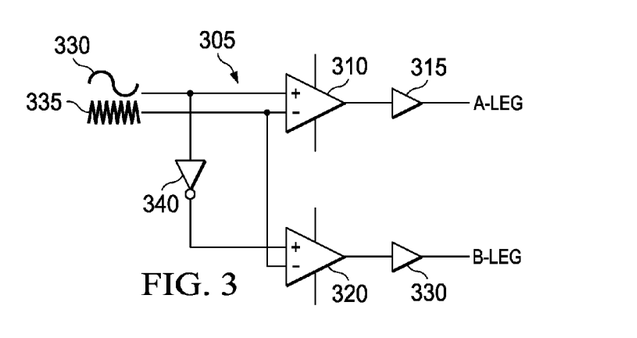
FIG. 3 comprises a circuit diagram illustrating an example BD-modulation scheme as may be applied to a motor for motor control as configured in accordance with various embodiments of the invention.
Figure 4:
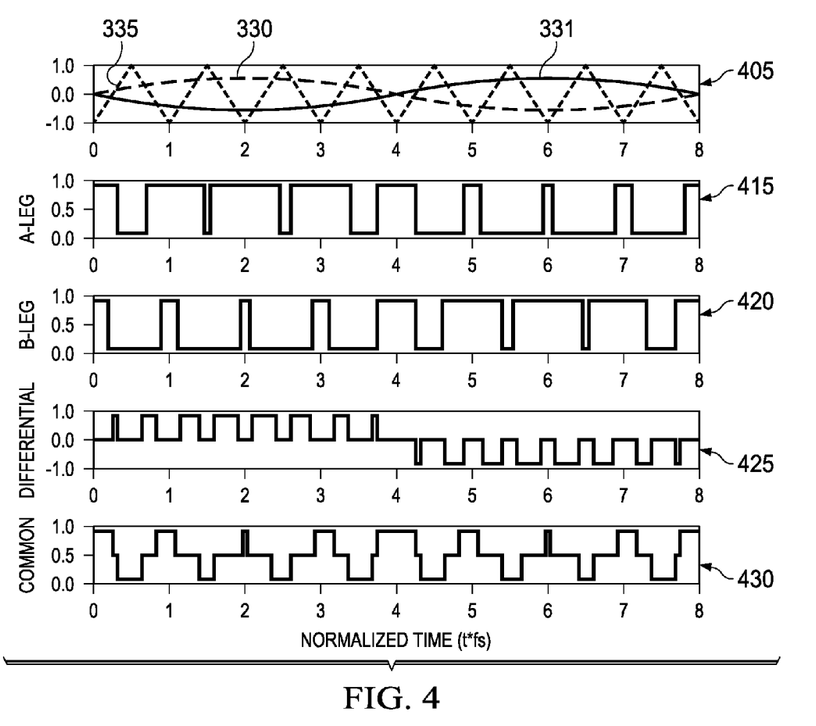
FIG. 4 comprises a signal diagram of the example BD-modulation scheme of FIG. 3.

FIGS. 3 and 4 illustrate an example modulation scheme for the example where the driver 205 is a BD or Low Side Recirculation modulated class D driver 305. The driver 305 includes two comparators 310 and 320, each having an output provided to a corresponding amplifier 315 and 325, respectively, to amplify the outgoing signals being provided on the A-leg and B-leg, respectively, of the driver. More specifically, the first comparator 310 compares the input waveform 330 to a high frequency sawtooth or triangular waveform 335 to provide a digital output. An inverter 340 inverts the input waveform 330 to create an inverted input waveform 331 that is provided to the second comparator 320 to compare to the high frequency sawtooth or triangular waveform 335 to provide a second digital output. FIG. 4 illustrates these signals with the input waveform 330, inverted input waveform 331, and high frequency sawtooth or triangular waveform 335 illustrated together in time in the top graph 405. The first comparator's 310 output signal on the A-leg is illustrated in the next graph 415, and the second comparator's 320 output signal on the B-leg is illustrated in the next graph 420. The differential signal between the A-leg and the B-leg signals (A-leg signal minus B-leg signal) is illustrated in the next graph 425. The common signal (average of the A-leg and B-leg signals) is illustrated in the last graph 430. So configured, the input signal 330 is converted to a pulse-width signal.

Figure 5:
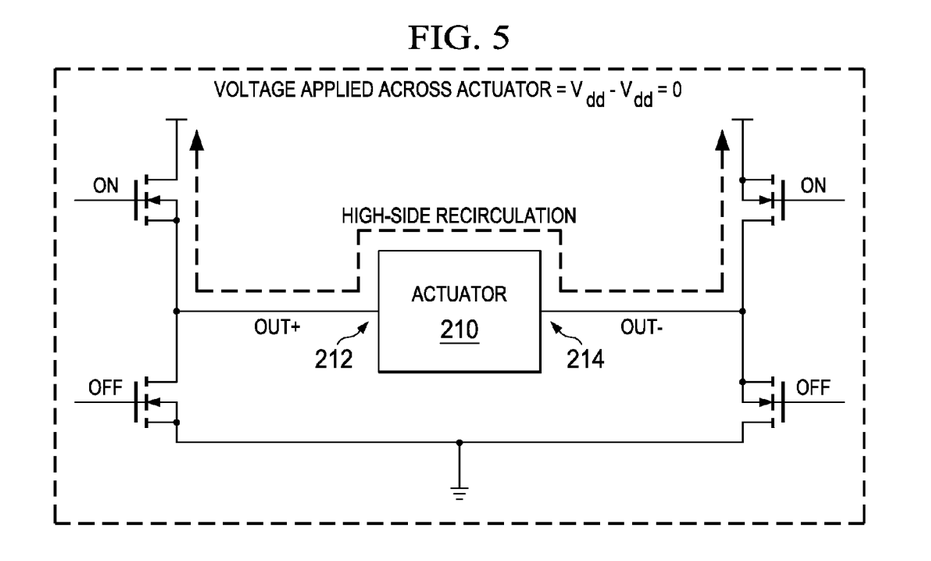
FIG. 5 comprises a circuit diagram illustrating an example zero voltage point of a driver input to an actuator from a driver at a high-side recirculation phase of the driver input as configured in accordance with various embodiments of the invention.
Figure 6:
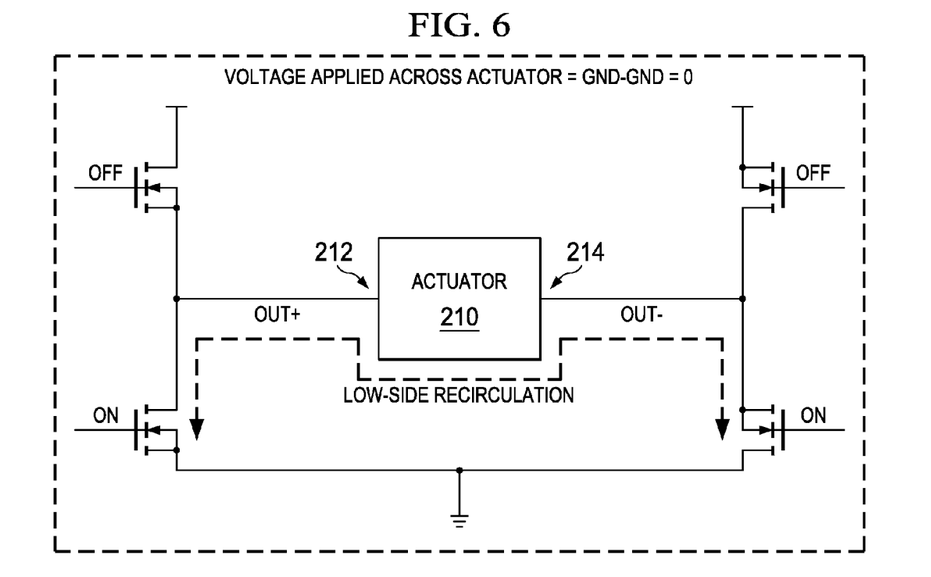
FIG. 6 comprises a circuit diagram illustrating an example zero voltage point of a driver input to an actuator from a driver at a low-side recirculation phase of the driver input as configured in accordance with various embodiments of the invention.

During the High Side Recirculation (HSR) or LSR phase of the output, the voltage applied across the actuator will at specific instances be zero during the driver's normal recirculation operation. These situations are illustrated in FIGS. 5 and 6, respectively. In FIG. 5, illustrating high-side recirculation, the high frequency component of the differential voltage across the actuator's 210 inputs 212 and 214 is zero although the signal on the OUT+ and OUT− are both high. In FIG. 6, illustrating low-side recirculation, differential across the actuator's 210 inputs 212 and 214 is zero where the signal on the OUT+ and OUT− are both low or ground. At these points in the driver's operation, the only potential across the terminals is the BEMF. This is permissible because the Class D output is at a very high frequency relative to the motor's motion. The actuator itself acts like a low-pass filter and only responds to the low frequency components. The inertia of the motor keeps it moving during this stage of momentary zero input. Hence the actuator itself continuously in motion and generates a BEMF proportional to the velocity at which it is moving during the zero point in input. This BEMF can then be measured across the actuator terminals without interference from the driver input.

Another aspect of systems operating according to the model illustrated in FIG. 1 is that the maximum BEMF of the actuator corresponds with the zero-crossing of the current. During operation, a current flows through the motor, which current is dependent on various aspects including the input signal from the driver, the motor's characteristics, and the like. One aspect of the current is that the actuator's inductance causes a kick-back voltage from the actuator in response to a change in actuator current. If the capacitive elements are ignored where only the input signal $Z_{in}$ (in Volts), BEMF, and inductive elements from FIG. 1 are considered, the electrical relationship is described with respect to a current, I, flowing in the actuator with the following equation:

$$Z_{in} = R_{ind} * I + L\frac{dI}{dt} + V_{back-emf}.$$

When the voltage in, $Z_{in}$, is quickly changed to zero, the applied potential goes to 0V. The dI/dt term from the inductance can cause a kick-back current that adds inaccuracy to the BEMF measurement. In an audio speaker example, because the BEMF is proportional to velocity, maximum BEMF corresponds to mid-displacement for a speaker diaphragm. This is similar to how the velocity of a pendulum is maximum at the zero displacement point from the center point of its swing. This zero crossing has a corresponding instantaneous high frequency input phase of zero Volts during either the High Side Recirculation Phase or the Low Side Recirculation Phase of the Class D output.

Figure 7:
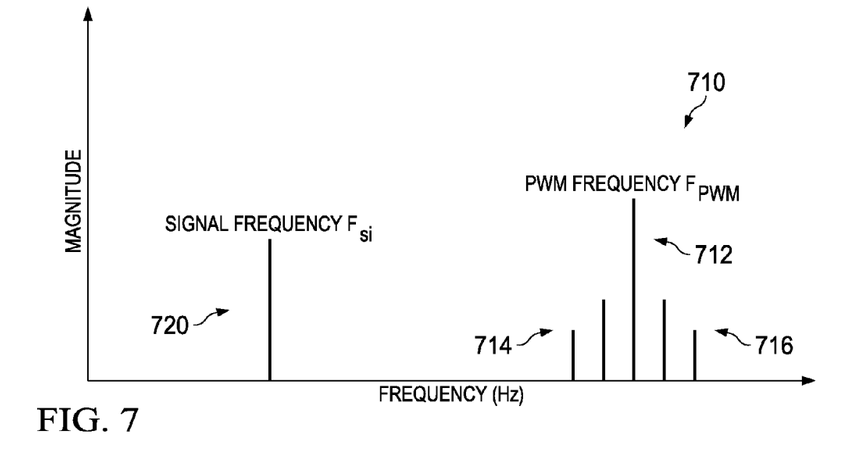
FIG. 7 comprises a graph illustrating an example spread of signal frequency and magnitude for one approach to driving a motor as configured in accordance with various embodiments of the invention.
Figure 8:
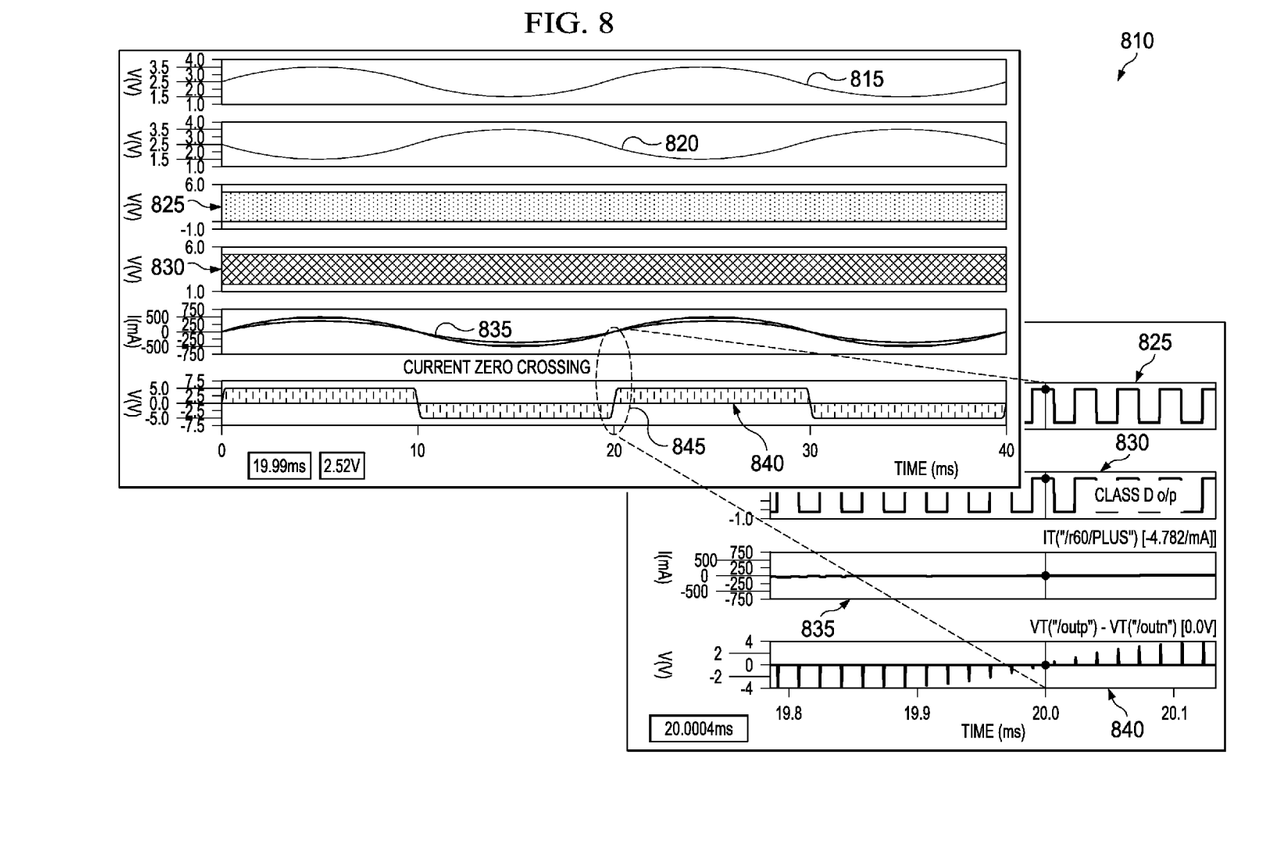
FIG. 8 comprises a set of graphs illustrating various signals for an example operation of a motor as configured in accordance with various embodiments of the invention.

Turning to FIGS. 7-9, the signaling involved with such an approach will be further described. FIG. 7 illustrates conceptually the difference between the high frequency pulse width modulated input signal 710 applied from the driver to a motor and the lower frequency signal 720 experienced by the motor because of the filtering effects of the motor's electrical characteristics. The high frequency input signal 710 has a primary high frequency component 712 and lower in voltage magnitude harmonics 714 and 716 of that primary high frequency component 712. Although the driver applies this high frequency input signal 710 to the motor, the motor only sees the lower frequency signal 720 because the motor's components act like a low pass filter, thereby only allowing this lower frequency signal 720 to be experienced by the motor. Because of this low pass filter aspect, the instantaneous voltage for the high frequency input signal 710 can be zero volts while at the same time the signal experienced by the motor is the lower frequency non-zero signal 720. In this way, the BEMF can be measured during normal operation of the driver to avoid the negative effects of having to stop the driver as done in certain previous approaches. The indicated area 845 illustrates where the current crosses the zero point during the operation of the driver and motor. This portion of the graphs is illustrated in the second set of graphs 850, which is merely the same graphs from set 810 using a zoomed in time scale (from 10s of milliseconds to tenths of milliseconds), which shows the instantaneous values for these signals. At the 20.0 millisecond mark, the instantaneous high frequency signal from the driver that is applied to the motor is zero. One can see that at that same time, the current across the motor crosses the zero point. Accordingly, this is an advantageous time to take the BEMF measurement.

Moreover, with certain drivers, the instantaneous zero voltage input corresponds to a zero current point across the motor's terminals. FIG. 8 illustrates an example of various signals for one example system to illustrate the current zero crossing as compared to the instantaneous zero voltage input signal. The top set of graphs 810 illustrates over a relatively long time period various signals in the system including aspects of the low frequency component of the voltage applied to the motor as seen by the motor as a result of the low pass filter characteristics of the motor illustrated at graphs 815 and 820, the high frequency signals from the OUT+ and OUT− terminals of the driver illustrated at graphs 825 and 830, the current across the two terminals of the motor illustrated at graph 835, and the instantaneous high frequency input signal applied to the motor from the driver illustrated at graph 840.

Figure 9:
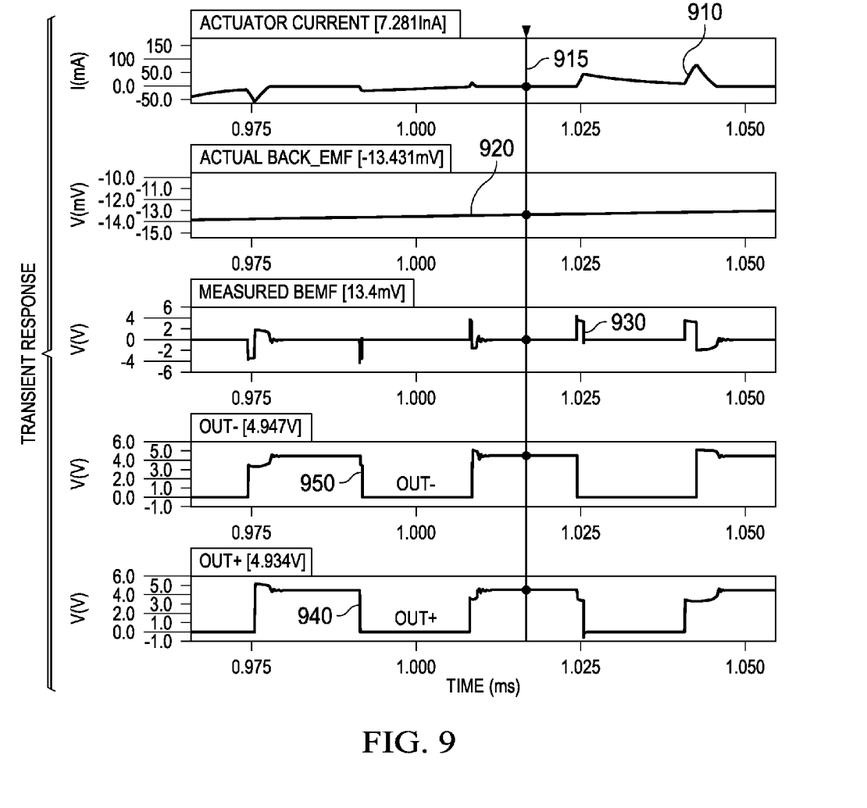
FIG. 9 comprises a set of graphs illustrating various signals for an example operation of a motor as configured in accordance with various embodiments of the invention.

FIG. 9 illustrates similar graphs from a simulation of an example approach. The top graph 910 illustrates the current across the two terminals with the zero crossing point 915 indicated. At the corresponding point 915 in the other graphs, the actual BEMF graph 920 has a value of 13.43 mV, whereas the measured BEMF graph 930 shows a value of 13.4 mV. The OUT+ and OUT− signals from the driver are illustrated in graphs 940 and 950, respectively. The measured BEMF graph 930 and the actuator current graph 910 demonstrate the disturbances coincident with changes in the applied input voltages.

Accordingly, with reference again to FIG. 2, the controller 240 may be configured to activate the voltage sensor 230 to measure the back-emf both when the instantaneous high frequency input from the driver 205 to the motor 210 is approximately zero Volts and when a current across the two terminal input 212 and 214 is approximately zero amps. Detecting the actuator current threshold (or zero crossing) can be done using several standard schemes already present in most Class D. Thus, where the driver 205 is configured to sense current across the two terminal input 212 and 214 to determine when the current is approximately zero amps, the controller 240 can be connected to receive information from the driver 205 regarding when the current is approximately zero amps to detect the BEMF.

So configured, a motor driver system does not require a multitude of "sense" components for BEMF sensing, and the sensing is independent of actuator characteristics. The same approach can be used with motors, speakers, and the like. Because the load is continuously being driven, there is no restriction on the maximum output duty cycle. Additionally, no second order frequencies are superimposed on the actuator drive signal, which can be especially important when driving speaker-like loads where the audible harmonics need to be minimized. Further advantages to the described teachings are that such approaches can be used with two terminal actuators and that there is no need to filter outputs before feeding back to loop. The design of feedback amplifiers in such approaches is much less complicated due to the common mode of the input signal being constant, and there is no need for complicated signal processing to obtain BEMF value. Moreover, the use of Class D driver stage results in high efficiency.

Figure 10:
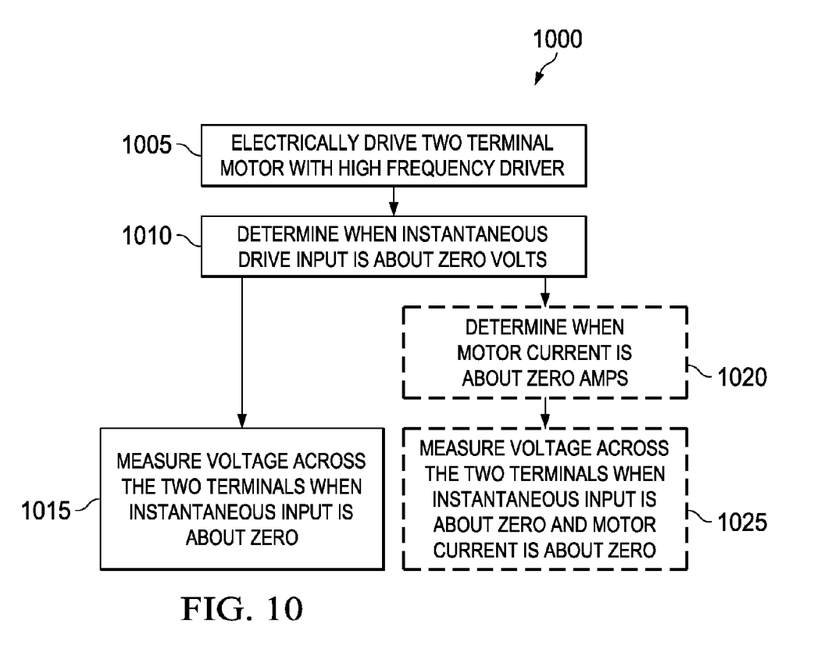
FIG. 10 comprises a flow diagram of an example BEMF measurement approach as configured in accordance with various embodiments of the invention.

Turning to FIG. 10, an example method 1000 of detecting BEMF in accordance with these teachings will be described. The method 1000 includes driving 705 a motor across the motor's two terminal input with a high frequency input from a driver having a recirculation phase, which may be a BD or Low Side Recirculation modulated class D driver. The method 1000 further includes monitoring an output from the driver to determine 1010 when an instantaneous high frequency input from the driver to the motor is approximately zero Volts. When the instantaneous high frequency input from the driver to the motor is approximately zero Volts, the method includes controlling 1015 a voltage sensor electrically connected across the two terminal input to sense a voltage. Where the driver is a BD or Low Side Recirculation modulated class D driver, the voltage sensor is activated to measure the voltage when the instantaneous high frequency input applied by the BD or Low Side Recirculation modulated class D driver is zero during a recirculation phase for the BD or Low Side Recirculation modulated class D driver. To measure the maximum BEMF, the method 1000 may further include determining 1020 when a current across the two terminal input is about zero amps. For example, this can be done by monitoring an output from the driver to determine when the current across the two terminal input is approximately zero amps. In this approach, the voltage sensor is activated to measure 1025 the voltage both when the instantaneous high frequency input from the driver to the motor is approximately zero Volts and when a current across the two terminal input is approximately zero amps.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An apparatus comprising:
   a high frequency driver having a recirculation phase, the driver connected to drive a motor across a two terminal input for the motor;
   a voltage sensor connected across the two terminal input;
   a controller operatively coupled to the driver and the voltage sensor to activate the voltage sensor to measure a voltage representative of back-emf of the motor across the two terminal input when an instantaneous high frequency input from the driver to the motor is approximately zero Volts.

2. The apparatus of claim 1 wherein the driver comprises a BD or Low Side Recirculation modulated class D driver.

3. The apparatus of claim 2 wherein the controller is configured to activate the voltage sensor to measure the back-emf when the instantaneous high frequency input applied by the BD or Low Side Recirculation modulated class D driver is zero during a recirculation phase for the BD or Low Side Recirculation modulated class D driver.

4. The apparatus of claim 1 wherein the controller is configured to monitor an output from the driver to determine when the instantaneous high frequency input from the pulse modulation driver to the motor is approximately zero Volts.

5. The apparatus of claim 1 wherein the controller is configured to activate the voltage sensor to measure the back-emf when both the instantaneous high frequency input from the pulse modulation driver to the motor is approximately zero Volts and when a current across the two terminal input is approximately zero amps.

6. The apparatus of claim 5 wherein the driver is configured to sense the current across the two terminal input to determine when the current is approximately zero amps.

7. The apparatus of claim 6 wherein the controller is connected to receive information from the driver regarding when the current across the two terminal input is approximately zero amps.

8. A method comprising:
   driving a motor across the motor's two terminal input with a high frequency input from a driver having a recirculation phase;
   controlling a voltage sensor electrically connected across the two terminal input to sense a voltage when an instantaneous high frequency input from the driver to the motor is approximately zero Volts.

9. The method of claim 8 wherein the driving the motor comprises driving the motor with a BD or Low Side Recirculation modulated class D driver.

10. The method of claim 9 further comprising activating the voltage sensor to measure the voltage when the instantaneous high frequency input applied by the BD or Low Side Recirculation modulated class D driver is zero during a recirculation phase for the BD or Low Side Recirculation modulated class D driver.

11. The method of claim 8 further comprising monitoring an output from the driver to determine when the instantaneous high frequency input from the pulse modulation driver to the motor is approximately zero Volts.

12. The method of claim 8 further comprising activating the voltage sensor to measure the voltage when both the instantaneous high frequency input from the driver to the motor is approximately zero Volts and when a current across the two terminal input is approximately zero amps.

13. The method of claim 8 further comprising monitoring an output from the driver to determine when a current across the two terminal input is approximately zero amps.

14. An apparatus comprising:
   a BD or Low Side Recirculation modulated class D driver connected to drive a motor across a two terminal input for the motor with a high frequency input and configured to sense current across the two terminal input to determine when the current is approximately zero amps;
   a voltage sensor connected across the two terminal input;
   a controller operatively coupled to the BD or Low Side Recirculation modulated class D driver to receive information regarding when the current across the two terminal input is approximately zero amps and to monitor an output from the BD or Low Side Recirculation modulated class D driver to determine when an instantaneous high frequency input from the BD or Low Side Recirculation modulated class D driver during normal operation to the motor is approximately zero Volts;
   the controller further operatively coupled the voltage sensor to activate the voltage sensor to measure a voltage representative of back-emf of the motor across the two terminal input when both:
   the instantaneous high frequency input from the BD or Low Side Recirculation modulated class D driver to the motor is approximately zero Volts during a normal operation recirculation phase for the BD or Low Side Recirculation modulated class D driver, and
   the current across the two terminal input is approximately zero amps.

* * * * *